(12) United States Patent
Atwood et al.

(10) Patent No.: US 9,971,147 B2
(45) Date of Patent: May 15, 2018

(54) INTEGRATED MICRO-CHANNEL HEATSINK IN DMD SUBSTRATE FOR ENHANCED COOLING CAPACITY

(71) Applicant: Xerox Corporation, Norwalk, CT (US)

(72) Inventors: Christopher D. Atwood, Rochester, NY (US); Mark A. Adiletta, Fairport, NY (US); Ali R. Dergham, Fairport, NY (US); Roger G. Leighton, Hilton, NY (US); Francisco Zirilli, Fairport, NY (US)

(73) Assignee: Xerox Corporation, Norwalk, CT (US)

( * ) Notice: Subject to any disclaimer, the term of this patent is extended or adjusted under 35 U.S.C. 154(b) by 0 days. days.

(21) Appl. No.: 15/275,633

(22) Filed: Sep. 26, 2016

(65) Prior Publication Data

US 2018/0088319 A1 Mar. 29, 2018

(51) Int. Cl.
| | |
|---|---|
| *G02B 26/00* | (2006.01) |
| *G02B 26/08* | (2006.01) |
| *B81B 7/00* | (2006.01) |
| *B81C 1/00* | (2006.01) |
| *G03F 7/20* | (2006.01) |

(52) U.S. Cl.
CPC ........ *G02B 26/0833* (2013.01); *B81B 7/0019* (2013.01); *B81C 1/00333* (2013.01); *G03F 7/70891* (2013.01); *B81B 2201/042* (2013.01)

(58) Field of Classification Search
CPC ...... G03B 21/16; G03B 21/008; H04N 9/314; G02B 26/0833; G02B 26/0841; G02B 26/085; G02B 26/00

USPC .................................................. 359/238–324
See application file for complete search history.

(56) References Cited

U.S. PATENT DOCUMENTS

| | | | |
|---|---|---|---|
| 5,061,049 A | 10/1991 | Hornbeck | |
| 5,490,009 A | 2/1996 | Venkateswar et al. | |
| 5,990,917 A * | 11/1999 | Wendt ................ | H04N 1/40037 347/187 |
| 7,324,279 B2 | 1/2008 | Penn | |
| 8,345,242 B2 | 1/2013 | Schumaker et al. | |
| 8,508,791 B1 | 8/2013 | Paul et al. | |
| 9,036,244 B2 | 5/2015 | Maxik et al. | |
| 9,137,504 B2 | 9/2015 | Gelb et al. | |
| 9,344,696 B2 | 5/2016 | Kempf et al. | |
| 2001/0041381 A1 | 11/2001 | Choi | |
| 2002/0163625 A1* | 11/2002 | Tabuchi ................ | G02B 5/003 353/31 |

(Continued)

OTHER PUBLICATIONS

Lee, B., DMD 101: Introduction to Digital Micromirror Device (DMD) Technology, Texas Instrument Application Report, DLPA008A—Jul. 2008—Revised Oct. 2013, 11 pages.

(Continued)

*Primary Examiner* — Mahidere Sahle
(74) *Attorney, Agent, or Firm* — Kermit D. Lopez; Luis M. Ortiz; Ortiz & Lopez, PLLC

(57) ABSTRACT

A DMD cooling apparatus and method includes a DMD chip configured on a substrate, and a heatsink located within and integrated into the substrate upon which the DMD is configured. A plurality of micro-channels can be formed on a backside of the substrate. The micro-channels are fabricated via microlithography in association with a fabrication of the DMD chip such that the heatsink integrated into the silicon substrate allows for direct heat removal from the substrate.

19 Claims, 6 Drawing Sheets

(56) References Cited

U.S. PATENT DOCUMENTS

| | | |
|---|---|---|
| 2003/0020882 A1 | 1/2003 | Kalyandurg et al. |
| 2004/0150083 A1 | 8/2004 | Choi |
| 2005/0012905 A1* | 1/2005 | Morinaga ............... G03B 21/18 353/58 |
| 2006/0027514 A1 | 10/2006 | Kang et al. |
| 2009/0141248 A1* | 6/2009 | Suzuki .................. G03B 21/16 353/61 |
| 2012/0069342 A1 | 3/2012 | Dalgleish et al. |
| 2014/0000851 A1* | 1/2014 | Wang ..................... F28D 15/02 165/104.26 |
| 2015/0377446 A1 | 12/2015 | Bhakta |
| 2017/0133240 A1* | 5/2017 | Kim .................... H01L 21/4882 |

OTHER PUBLICATIONS

Using Lasers with DLP DMD Technology, Texas Instruments, DLPA037, Lasers & DLP, TI DN 2509927, Sep. 2008, 10 pages.
The Digital Micromirror Device, A Historic Mechanical Engineering Landmark, Texas Instrument, Plano, TX, May 1, 2008, 20 pages.
Horsley, S. D., Digital Micromirror Device (DMD), From R&D to a Profitable Business, DLP, A Texas Instruments Technology, 24 pages.

* cited by examiner

INTEGRATED MICRO-CHANNEL HEATSINK IN DMD SUBSTRATE FOR ENHANCED COOLING CAPACITY

TECHNICAL FIELD

Embodiments are generally related to DMD (Digital Micro-mirror Device) systems and applications. Embodiments are also related to micro-channel heatsink components integrated with a DMD substrate for enhanced cooling.

BACKGROUND

Offset lithography is a common method utilized in modern printing operations. (Note that as utilized herein, the terms "printing" and "marking" are interchangeable.) In a typical lithographic process, a printing plate (i.e., which may be a flat plate, the surface of a cylinder, belt, etc.) can be configured with "image regions" formed of, for example, hydrophobic and oleophilic material, and "non-image regions" formed of a hydrophilic material. Such image regions correspond to the areas on the final print (i.e., the target substrate) that are occupied by a printing or a marking material such as ink, whereas the non-image regions correspond to the areas on the final print that are not occupied by the marking material.

The Variable Data Lithography (also referred to as Digital Lithography or Digital Offset) printing process begins with a fountain solution used to dampen a silicone imaging plate on an imaging drum. The fountain solution forms a film on the silicone plate that is on the order of about one (1) micron thick. The drum rotates to an 'exposure' station where a high power laser imager is used to remove the fountain solution at the locations where the image pixels are to be formed. This forms a fountain solution based 'latent image.' The drum then further rotates to a 'development' station where lithographic-like ink is brought into contact with the fountain solution based 'latent image' and ink 'develops' onto the places where the laser has removed the fountain solution. The ink is hydrophobic. An ultra violet (UV) light may be applied so that photo-initiators in the ink may partially cure the ink to prepare it for high efficiency transfer to a print media such as paper. The drum then rotates to a transfer station where the ink is transferred to a printing media such as paper. The silicone plate is compliant, so an offset blanket is not used to aid transfer. UV light may be applied to the paper with ink to fully cure the ink on the paper. The ink is on the order of one (1) micron pile height on the paper.

The formation of the image on the printing plate is accomplished with imaging modules each using a linear output high power infrared (IR) laser to illuminate a digital light projector (DLP) multi-mirror array, also referred to as the "DMD" ("Digital Micro-mirror Device" or "Digital Micromirror Device"). The mirror array is similar to what is commonly used in computer projectors and some televisions. The laser provides constant illumination to the micro-mirror array. The mirror array deflects individual mirrors to form the pixels on the image plane to pixel-wise evaporate the fountain solution on the silicone plate. If a pixel is not to be turned on, the mirrors for that pixel deflect such that the laser illumination for that pixel does not hit the silicone surface, but goes into a chilled light dump heat sink.

A single laser and mirror array can form an imaging module that provides an imaging capability for approximately one (1) inch in the cross-process direction. Thus, a single imaging module simultaneously images a one (1) inch by one (1) pixel line of the image for a given scan line. At the next scan line, the imaging module images the next one (1) inch by one (1) pixel line segment. By utilizing several imaging modules each composed of several lasers and several mirror-arrays, butted together, an imaging functionality for a very wide cross-process width can be achieved.

One non-limiting example of a DMD system utilized in the context of a lithographic application is disclosed in U.S. Pat. No. 8,508,791, entitled "Image feedforward laser power control for a multi-mirror based high power imager," which issued to Peter Paul et al on Aug. 13, 2013, and is assigned to Xerox Corporation of Norwalk, Conn. U.S. Pat. No. 8,508,791 is incorporated herein by reference in its entirety.

A major problem with prior art DMD systems is that the light source is the input to the DMD that then reflects the signal processor controlled on/off digital output. The input light source generates too much heat into the DMD chip under certain applications resulting in the failure of the chip. New approaches are thus needed to prevent DMDs from overheating.

BRIEF SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

It is, therefore, one aspect of the disclosed embodiments to provide an improved DMD cool apparatus, system, and method.

It is another aspect of the disclosed embodiments to provide for an integrated micro-channel heatsink in a DMD substrate for enhanced cooling capacity.

The aforementioned aspects and other objectives and advantages can now be achieved as described herein. A DMD cooling apparatus and method includes a DMD chip configured on a substrate and a heatsink located within and integrated into the substrate upon which the DMD is configured. A plurality of micro-channels can be formed on a backside of the substrate. The micro-channels can be fabricated, for example, via microlithography in association with a fabrication of the DMD chip such that the heatsink integrated into the silicon substrate allows for direct heat removal from the substrate.

The disclosed example embodiments thus describe an approach to enhancing the cooling capacity of a DMD for high power applications using an integrated heatsink located inside the DMD chip, which is composed of a series of micro-channels formed on the backside of the silicon wafer and fabricated using standard microlithography techniques in conjunction with the fabrication of the DMD chip. Note that the concept has been partially validated using a computer simulation. A calculation was used to show that using coolant consisting of a mixture of water and ethylene glycol at 15° C. in the micro-channels, the maximum temperature of the chip surface can be maintained at acceptable levels at maximum power. Benefits of the disclosed embodiments include enabling the DMD to meet the power requirements for high power applications.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

The particular values and configurations discussed in these non-limiting examples can be varied and are cited merely to illustrate one or more embodiments and are not intended to limit the scope thereof.

Subject matter will now be described more fully hereinafter with reference to the accompanying drawings, which form a part hereof, and which show, by way of illustration, specific example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware or any combination thereof (other than software per se). The following detailed description is, therefore, not intended to be interpreted in a limiting sense.

Throughout the specification and claims, terms may have nuanced meanings suggested or implied in context beyond an explicitly stated meaning. Likewise, phrases such as "in one embodiment" or "in an example embodiment" and variations thereof as utilized herein do not necessarily refer to the same embodiment and the phrase "in another embodiment" or "in another example embodiment" and variations thereof as utilized herein may or may not necessarily refer to a different embodiment. It is intended, for example, that claimed subject matter include combinations of example embodiments in whole or in part.

In general, terminology may be understood, at least in part, from usage in context. For example, terms such as "and," "or," or "and/or" as used herein may include a variety of meanings that may depend, at least in part, upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein, depending at least in part upon context, may be used to describe any feature, structure, or characteristic in a singular sense or may be used to describe combinations of features, structures, or characteristics in a plural sense. Similarly, terms such as "a," "an," or "the", again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Figure 1:
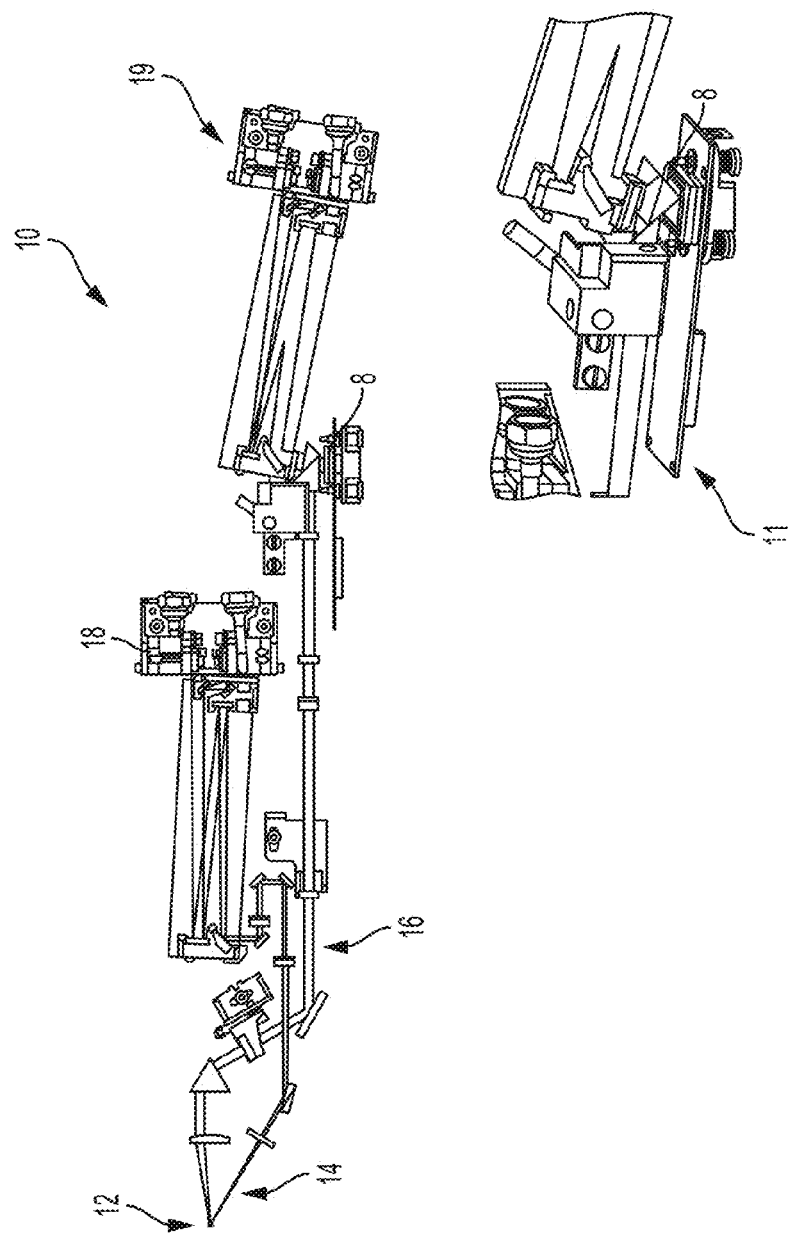
FIG. 1 illustrates a schematic diagram of an LIM (Laser Imaging Module) and a LIM optical path, in accordance with an example embodiment.

FIG. 1 illustrates a schematic diagram of an LIM (Laser Imaging Module) system 10 and an LIM optical path, in accordance with an example embodiment. The LIM system 10 generally includes preheat LDAs (Laser Diode Arrays) 18 and imaging LDAs 19. Imaging path rays 16 are shown extending leftward from the DMD 8. In addition, an imaging plane 12 is shown in FIG. 1 with respect to the preheat path rays 14. A close-up view 11 of the DMD 8 is also shown in FIG. 1. Note that the two image paths are not combined at the substrate surface. The preheat beam can be utilized to pre-heat the substrate to a specified temperature before the imaging beam actually writes on the substrate. The system 10 can be designed so that 320 Watts of power, for example, can be applied to the system. In such an example scenario, the DMD 8, however, may absorb 38 Watts and then overheats. The system may overheat even at only 80% of the designed power.

The laser output can be directed to substrates that have been coated with photochromatic ink. Each pixel on the substrate responds in a gradient to the amount of energy applied. Although printing is possible with the limited power currently in use on a limited number of ink/substrate combinations, being able to apply to the full power is needed to get the desired range of response on all ink/substrate combinations at a specific pixel.

Figure 2:
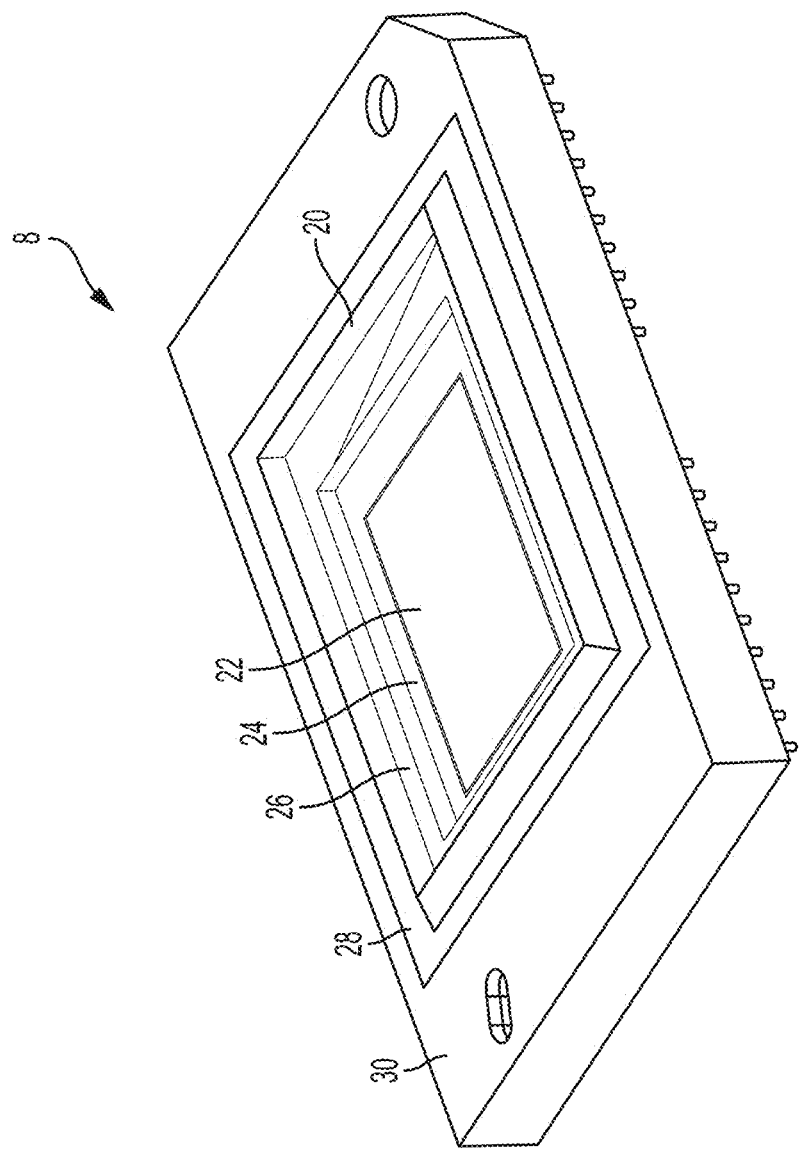
FIG. 2 illustrates a pictorial diagram of a DMD in accordance with an example embodiment.

FIG. 2 illustrates a pictorial diagram of the DMD 8 in accordance with an example embodiment. Note that the DMD 8 can also be referred to as a "DMD chip" in some embodiments. The DMD generally includes a housing 30 (e.g., alumina housing) and an epoxy seal 28 located above a support bezel 26 and a silicon substrate 24. A mirror array 22 is located below a glass cover 20.

Figure 3:
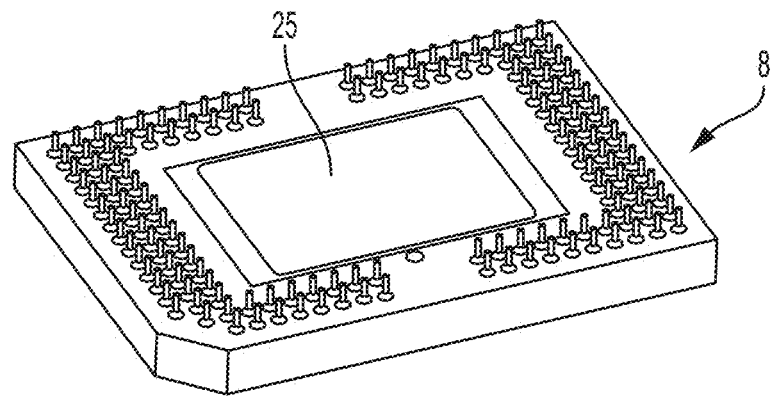
FIG. 3 illustrates the backside of the DMD depicted in FIGS. 1-2 in accordance with an example embodiment.

FIG. 3 illustrates the backside of the DMD 8 depicted in FIGS. 1-2 in accordance with an example embodiment. A current heatsink interface area 25 is shown centrally and at the backside of the DMD 8 as shown in FIG. 3.

Figure 4:
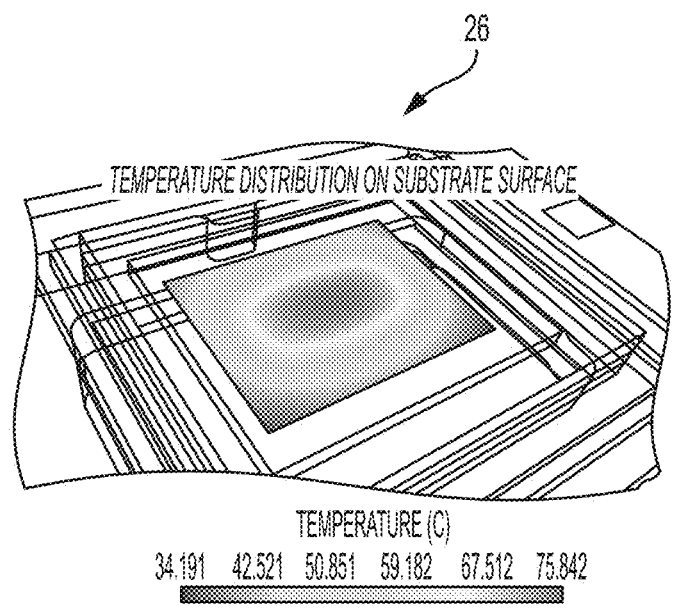
FIG. 4 illustrates a heat diagram depicting the DMD substrate temperature, in accordance with an example embodiment.

FIG. 4 illustrates a heat diagram depicting the DMD substrate temperature distribution 26, in accordance with an example embodiment. FIG. 4 shows the temperature distribution on the silicon substrate of the DMD. The peak temperature in the substrate is nearly 76° C., while the maximum allowable temperature is 55° C. The coolant temperature is currently at 15° C. and cannot be reduced more because it causes condensation inside the LIM.

Figure 5:
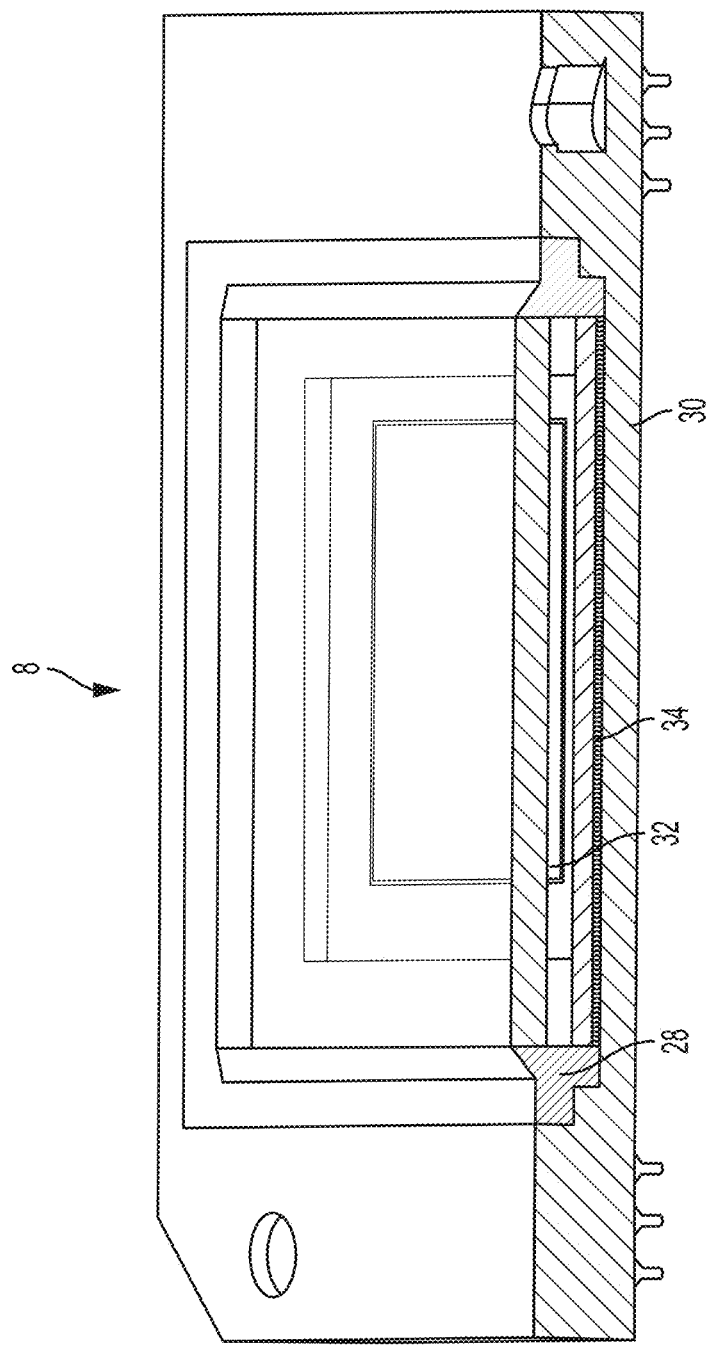
FIG. 5 illustrates a cutaway view of a DMD configured with a micro-channel cooling arrangement, in accordance with an example embodiment.

FIG. 5 illustrates a cutaway view of the DMD 8 configured with a micro-channel cooling arrangement, in accordance with an example embodiment. The DMD 8 can be configured with an epoxy seal 28 and a housing 30. In addition, the DMD 8 can be configured to include a micro-mirror array 32 and a micro-channel cooling array 34.

Figure 6:
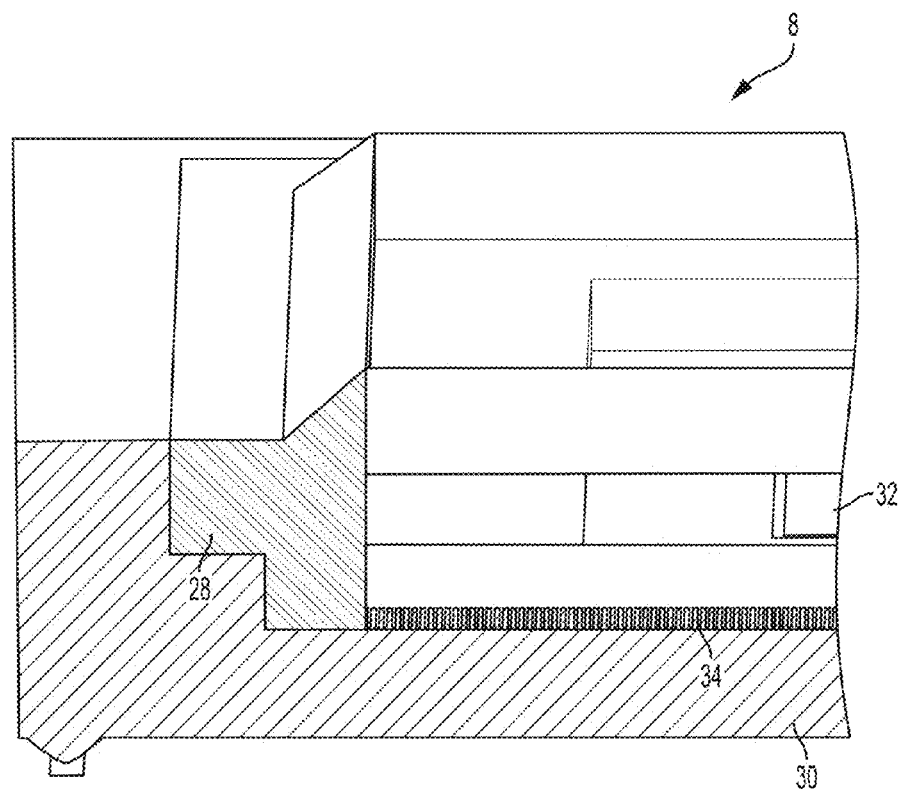
FIG. 6 illustrates a close-up cutaway view of the DMD shown in FIG. 5 configured with a micro-channel cooling arrangement, in accordance with an example embodiment.

FIG. 6 illustrates a close-up cutaway view of the DMD shown in FIG. 5 configured with a micro-channel cooling arrangement, in accordance with an example embodiment.

Figure 7:
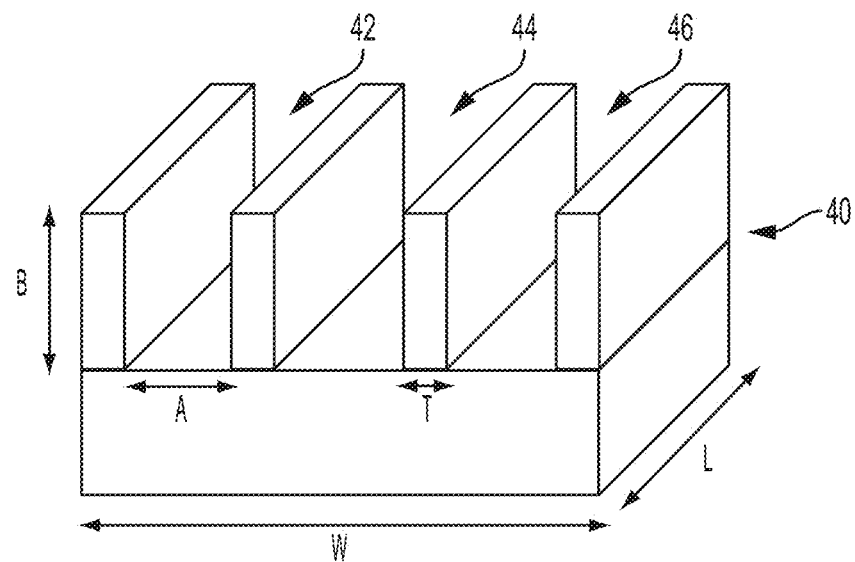
FIG. 7 illustrates a pictorial diagram depicting a plurality of micro-channels and parameters thereof, in accordance with an example embodiment.

The DMD 8 can be configured on a substrate and a heatsink can be located within and integrated into the substrate upon which the DMD 8 is configured. The micro-channel cooling array 34 is composed of a plurality of micro-channels formed on the backside of the substrate. Examples of such micro-channels are shown in FIG. 7. The micro-channels can be fabricated via microlithography in association with a fabrication of the DMD 8 such that the heatsink integrated into the silicon substrate allows for direct heat removal from the substrate. Based on the layout of an example DMD chip, micro-channels can be laid out across the chip as shown in FIGS. 5-6, with a length of, for example, 12 mm.

FIG. 7 illustrates a pictorial diagram depicting a plurality of micro-channels 40 and parameters thereof, in accordance with an example embodiment. Example micro-channels 42, 44, 46 are shown in FIG. 7. The height of the micro-channels is represented by b, while the width of the micro-channel gap is represented by a. The width of a micro-channel wall is represented by t, the width w, and length l of the base of the micro-channel array structure is also indicated in FIG. 7.

The use of such micro-channels 40 can enhance the cooling capacity of the DMD 8 for high power applications utilizing an integrated heatsink located inside the DMD chip. This heatsink is composed of a series of micro-channels (e.g., such as micro-channels 40) formed on the backside of the silicon wafer and fabricated using standard microlithography techniques in conjunction with the fabrication of the DMD chip.

FIG. 7 thus shows example micro-channel parameters: a channel width can be picked as, for example, 50 microns, a depth of 200 microns, and a fin width of 30 microns. The alumina housing 30 of the DMD chip 8 can be configured with an inlet port and outlet port added for a fluid path. As shown in FIG. 6, the epoxy seal 28 can keep any cooling fluid contained on the underside of the silicon substrate so none interferes with the mirrors on the upper surface of the DMD 8.

Figure 8:
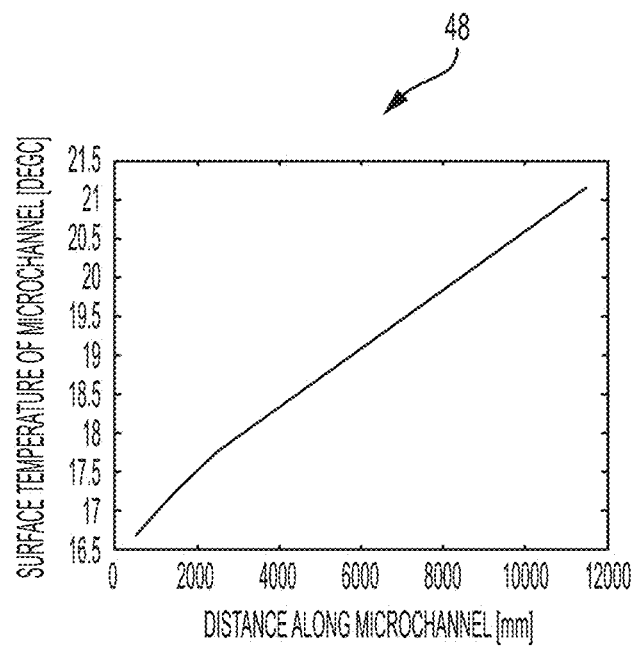
FIG. 8 illustrates a graph depicting data indicative of the simulation of the surface temperature of a silicon substrate, in accordance with an example embodiment.

FIG. 8 illustrates a graph 48 depicting data indicative of the simulation of the surface temperature of a silicon substrate, in accordance with an example embodiment. Note that for analysis purposes, the fluid path of each channel can be broken up into 12 segments so the temperature of the cooling fluid could be analyzed as it traveled along each channel. In some example embodiments, water can be utilized as the cooling fluid for such an analysis. In an example embodiment, the maximum width of the channel array that can fit is 17.694 mm, and an array of 220 channels can be produced with a width of 17.63 mm. The Reynolds Number can be calculated to determine whether the flow is laminar or turbulent. This can determine the correct correlations to use for the prediction of the cooling channel temperature distributions and heat fluxes.

A simulation in Matlab can be set up to calculate the temperature of the fluid at each of the 12 segments along the channel, and those temperatures used to calculate the temperature of the silicon substrate at each of the 12 segments. A matrix of dimensionless distance from the channel entrance can be calculated and the associated Nusselt numbers referenced from a three-wall H2 boundary condition chart of laminar flow in micro-channels. An initial condition of 15° C. fluid, for example, entering the micro-channel can be used for the first channel division and the calculated value of fluid temperature from each segment used as the input temperature to the next segment. These values can be utilized to produce a surface temperature matrix along the length of the channel, and a final surface temperature of the substrate at the end of the channel. The results from the Matlab simulation show the surface temperature at the outlet of the micro-channel would be 21.17° C. This is well under the specification of 55° C. (e.g., see FIG. 8 for the graph of silicon surface temperature along the length of the micro-channel).

The disclosed embodiments thus describe an approach to enhancing the cooling capacity of a DMD for high power applications using an integrated heatsink located inside the DMD chip, which is composed of a series of micro-channels formed on the backside of the silicon wafer and fabricated using standard microlithography techniques in conjunction with the fabrication of the DMD chip. Note that the concept has been partially validated using a computer simulation. A calculation was used to show that using coolant consisting of a mixture of water and ethylene glycol at 15° C. in the micro-channels, the maximum temperature of the chip surface can be maintained at acceptable levels at maximum power. Benefits of the disclosed embodiments include enabling the DMD to meet the power requirements for high power applications.

Based on the foregoing, it can be appreciated that a number of different embodiments are disclosed herein. For example, in one embodiment, a DMD cooling apparatus can be configured, which includes a DMD configured on a substrate; a heatsink located within and integrated into the substrate upon which the DMD is configured; and a plurality of micro-channels configured on a backside of the substrate, wherein the plurality of micro-channels is fabricated in association with a fabrication of the DMD such that the heatsink is integrated into the silicon substrate and allows for direct heat removal from the substrate.

In some example embodiments, the micro-channels can be fabricated via microlithography in association with the fabrication of the DMD. In an example embodiment, the aforementioned substrate can comprise silicon. In yet another example embodiment, the DMD can include a housing and an inlet port and outlet port formed from the housing. Such a housing can in some example embodiments be configured as an alumina housing.

In some example embodiments, fluid path can be formed between the inlet port and the outlet port, wherein the fluid path comprises the micro-channels. In yet other example embodiments, the DMD cooling apparatus can include an epoxy seal that contains cooling fluid disposed on the underside of the substrate so that none of the cooling fluid interferes with mirrors on an upper surface of the DMD.

In still another example embodiment, a DMD cooling apparatus can be implemented which includes a DMD configured on a substrate, wherein the DMD comprises a housing and an inlet port and outlet port formed from the housing; a heatsink located within and integrated into the substrate upon which the DMD is configured; and a plurality of micro-channels configured on a backside of the substrate, wherein the plurality of micro-channels is fabricated via microlithography in association with a fabrication of the DMD such that the heatsink is integrated into the silicon substrate and allows for direct heat removal from the substrate.

In still another example embodiment, a method of fabricating a DMD cooling apparatus can include steps or operations such as configuring a DMD on a substrate; locating a heatsink within and integrated into the substrate upon which the DMD is configured; and configuring a plurality of micro-channels on a backside of the substrate, wherein the plurality of micro-channels is fabricated in association with a fabrication of the DMD such that the heatsink is integrated into the silicon substrate and allows for direct heat removal from the substrate.

Additional steps or operations can include configuring the plurality of micro-channels via microlithography in association with the fabrication of the DMD; configuring the DMD to include a housing; forming an inlet port and outlet port from the housing; and/or forming a fluid path between the inlet port and the outlet port, wherein the fluid path comprises the plurality of micro-channels. In yet another example embodiment, a step or operation can be implemented for providing an epoxy seal that contains cooling fluid disposed on an underside of the substrate so that none of the cooling fluid interferes with mirrors on an upper surface of the DMD.

It will be appreciated that variations of the above-disclosed and other features and functions, or alternatives thereof, may be desirably combined into many other different systems or applications. It will also be appreciated that various presently unforeseen or unanticipated alternatives, modifications, variations or improvements therein may be subsequently made by those skilled in the art which are also intended to be encompassed by the following claims.

What is claimed is:
1. A DMD cooling apparatus, comprising:
 a DMD configured on a silicon substrate, said DMD including a mirror array located below a glass cover;
 a heatsink located within and integrated into said substrate upon which said DMD is configured, and wherein said heatsink comprises an integrated heatsink located inside a DMD chip that comprises said DMD; and
 a plurality of micro-channels in a micro-channel cooling arrangement configured on a backside of said substrate, said heatsink comprising said plurality of micro-channels through which a cooling fluid flows for cooling of said DMD wherein said plurality of micro-channels is fabricated in association with a fabrication of said DMD such that said heatsink is integrated into said substrate and allows for direct heat removal from said substrate and wherein a pre-heat beam from at least one LDA (Laser Diode Array) pre-heats said substrate to a specified temperature before an imaging beam from at least one imaging LDA writes on said substrate and wherein a laser output from said at least one LDA or said at least one imaging LDA is directed to a substrate coated with a photochromatic ink wherein each pixel on said substrate coated with said photochromatic ink responds in a gradient to an amount of energy applied by said laser output.

2. The apparatus of claim 1 wherein said cooling fluid comprises water.

3. The apparatus of claim 1 wherein said DMD comprises a housing and an inlet port and outlet port formed from said housing.

4. The apparatus of claim 3 wherein said housing comprises an alumina housing.

5. The apparatus of claim 3 wherein a fluid path for said cooling fluid is formed between said inlet port and said outlet port.

6. The apparatus of claim 5 wherein said fluid path for said cooling fluid comprises said plurality of micro-channels.

7. The apparatus of claim 5 further comprising an epoxy seal that contains cooling fluid disposed on an underside of said substrate so that none of said cooling fluid interferes with mirrors on an upper surface of said DMD.

8. A DMD cooling apparatus, comprising:
 a DMD configured on a substrate, wherein said DMD comprises a housing and an inlet port and outlet port formed from said housing, said DMD including a mirror array located below a glass cover;
 a heatsink located within and integrated into said substrate upon which said DMD is configured, and wherein said heatsink comprises an integrated heatsink located inside a DMD chip that comprises said DMD; and
 a plurality of micro-channels in a micro-channel cooling arrangement configured on a backside of said substrate, said heatsink comprising said plurality of micro-channels through which a cooling fluid flows for cooling of said DMD wherein said plurality of micro-channels is fabricated via microlithography in association with a fabrication of said DMD such that said heatsink is integrated into said substrate and allows for direct heat removal from said substrate and wherein a pre-heat beam from at least one LDA (Laser Diode Array) pre-heats said substrate to a specified temperature before an imaging beam from at least one imaging LDA writes on said substrate and wherein a laser output from said at least one LDA or said at least one imaging LDA is directed to a substrate coated with a photochromatic ink wherein each pixel on said substrate coated with said photochromatic ink responds in a gradient to an amount of energy applied by said laser output.

9. The apparatus of claim 8 wherein said cooling fluid comprises water.

10. The apparatus of claim 8 wherein said housing comprises an alumina housing and wherein said cooling fluid comprises water.

11. The apparatus of claim 8 wherein a fluid path of said cooling fluid is formed between said inlet port and said outlet port.

12. The apparatus of claim 11 wherein said fluid path comprises said plurality of micro-channels and further comprises an epoxy seal that contains cooling fluid disposed on an underside of said substrate so that none of said cooling fluid interferes with mirrors on an upper surface of said DMD.

13. A method of fabricating a DMD cooling apparatus, comprising:
 configuring a DMD on a silicon substrate;
 configuring said DMD to include a mirror array located below a glass cover;
 locating a heatsink within and integrated into said substrate upon which said DMD is configured, and wherein said heatsink comprises an integrated heatsink located inside a DMD chip that comprises said DMD; and
 configuring a plurality of micro-channels in a micro-channel cooling arrangement on a backside of said substrate, such that said heatsink is configured to comprise said plurality of micro-channels through which a cooling fluid flows for cooling of said DMD;
 configuring said plurality of micro-channels in association with a fabrication of said DMD such that said heatsink is integrated into said substrate and allows for direct heat removal from said substrate and wherein a pre-heat beam from at least one LDA (Laser Diode Array) pre-heats said substrate to a specified temperature before an imaging beam from at least one imaging LDA writes on said substrate and wherein a laser output from said at least one LDA or said at least one imaging LDA is directed to a substrate coated with a photochromatic ink wherein each pixel on said substrate coated with said photochromatic ink responds in a gradient to an amount of energy applied by said laser output.

14. The method of claim 13 further comprising configuring said plurality of micro-channels via microlithography in association with said fabrication of said DMD and wherein said cooling fluid comprises water.

15. The method of claim 14 further comprising:
configuring said DMD to include a housing; and
forming an inlet port and outlet port from said housing.

16. The method of claim 15 further comprising forming a fluid path for said cooling fluid between said inlet port and said outlet port.

17. The method of claim 16 wherein said fluid path comprises said plurality of micro-channels.

18. The method of claim 16 further comprising providing an epoxy seal that contains cooling fluid disposed on an underside of said substrate so that none of said cooling fluid interferes with mirrors on an upper surface of said DMD.

19. The method of claim 15 wherein said substrate comprises silicon and wherein said housing comprises an alumina housing.

* * * * *